(12) United States Patent
Miegel et al.

(10) Patent No.: US 9,390,203 B2
(45) Date of Patent: Jul. 12, 2016

(54) METHOD AND SYSTEM FOR OFF-LINE PROGRAMMING OF MULTIPLE INTERACTING ROBOTS

(71) Applicant: ABB AB, Vasteras (SE)

(72) Inventors: Volker Miegel, Julich (DE); Jochen Bargfrede, Magdeburg (DE); Jonas Anselmby, Alingsas (SE)

(73) Assignee: ABB AB, Vasteras (SE)

(*) Notice: Subject to any disclaimer, the term of this patent is extended or adjusted under 35 U.S.C. 154(b) by 0 days.

(21) Appl. No.: 14/664,294

(22) Filed: Mar. 20, 2015

(65) Prior Publication Data
US 2015/0190926 A1    Jul. 9, 2015

Related U.S. Application Data

(63) Continuation-in-part of application No. 11/629,284, filed as application No. PCT/EP2005/006436 on Jun. 15, 2005, now Pat. No. 9,104,197.

(60) Provisional application No. 60/579,263, filed on Jun. 15, 2004.

(51) Int. Cl.
*G06F 19/00* (2011.01)
*G06F 17/50* (2006.01)
(Continued)

(52) U.S. Cl.
CPC ............... *G06F 17/50* (2013.01); *B25J 9/1682* (2013.01); *G05B 19/425* (2013.01); *G05B 2219/39109* (2013.01); *G05B 2219/39135* (2013.01); *G05B 2219/40317* (2013.01)

(58) Field of Classification Search
CPC .......... B25J 9/1664; B25J 9/1671; B25J 9/16; G05B 19/425; G05B 2219/40317; G05B 2219/39135; G05B 19/418

USPC ................ 700/245, 248, 250, 255, 262, 264; 318/568.1, 568.11, 568.2; 901/6, 50; 345/326, 335
See application file for complete search history.

(56) References Cited

U.S. PATENT DOCUMENTS

| | | | |
|---|---|---|---|
| 4,590,578 | A | 5/1986 | Barto et al. |
| 4,761,745 | A | 8/1988 | Kodaira |

(Continued)

FOREIGN PATENT DOCUMENTS

| | | |
|---|---|---|
| DE | 100 50 481 A1 | 5/2002 |
| EP | 1 310 338 A2 | 5/2003 |

(Continued)

OTHER PUBLICATIONS

Jo, J-Y et al., "Virtual testing of agile manufacturing software using 3D graphical simulation." Robotics and Automation., 1997 Proceedings IEEE International Conference in Albuquerque, NM, Apr. 20-25, 1997; IEEE, New York, NY, vol. 2, Apr. 20, 1997, pp. 1223-1228.

(Continued)

*Primary Examiner* — Jaime Figueroa
(74) *Attorney, Agent, or Firm* — Buchanan Ingersoll & Rooney PC

(57) ABSTRACT

A method and apparatus are disclosed for off-line programming of multiple interacting robots. For example, a system for off-line programming of multiple interacting robots includes a computer for off-line programming and verification of program codes for multiple interacting robots and a robot controller connected to the computer to receive a download of at least one of the program codes for execution. Multiple interacting robots can be controlled by the robot controller.

10 Claims, 5 Drawing Sheets

(51) Int. Cl.
*B25J 9/16* (2006.01)
*G05B 19/425* (2006.01)

(56) References Cited

U.S. PATENT DOCUMENTS

| | | | |
|---|---|---|---|
| 4,998,050 | A | 3/1991 | Nishiyama et al. |
| 5,243,266 | A | 9/1993 | Kasagami et al. |
| 5,315,222 | A | 5/1994 | Kasagami et al. |
| 5,353,386 | A | 10/1994 | Kasagami et al. |
| 5,371,836 | A * | 12/1994 | Mitomi ............. G05B 19/4182 700/245 |
| 5,596,683 | A | 1/1997 | Kasagami et al. |
| 5,641,415 | A | 6/1997 | Kosaka et al. |
| 5,848,747 | A | 12/1998 | Nishi |
| 5,880,956 | A | 3/1999 | Graf |
| 5,889,924 | A | 3/1999 | Okabayashi et al. |
| 6,157,873 | A | 12/2000 | DeCamp et al. |
| 6,163,946 | A * | 12/2000 | Pryor ................... A01B 69/008 29/407.04 |
| 6,181,983 | B1 | 1/2001 | Schlemmer et al. |
| 6,327,518 | B1 | 12/2001 | Kaneko et al. |
| 6,330,495 | B1 | 12/2001 | Kaneko |
| 6,339,204 | B1 | 1/2002 | Kato et al. |
| 6,445,964 | B1 | 9/2002 | White et al. |
| 6,470,301 | B1 | 10/2002 | Barral |
| 6,509,576 | B2 | 1/2003 | Woo-Dong |
| 6,631,308 | B1 | 10/2003 | Kaneko et al. |
| 6,678,582 | B2 | 1/2004 | Waled |
| 6,928,337 | B2 | 8/2005 | Watanabe et al. |
| 7,702,491 | B2 | 4/2010 | Walacavage et al. |
| 8,170,716 | B2 * | 5/2012 | Coste-Maniere ...... A61B 19/22 128/897 |
| 2001/0004718 | A1 | 6/2001 | Gilliland et al. |
| 2001/0047224 | A1 | 11/2001 | Hietmann et al. |
| 2002/0038855 | A1 | 4/2002 | Hwang |
| 2003/0078694 | A1 | 4/2003 | Watanabe et al. |
| 2003/0100957 | A1 | 5/2003 | Chaffee et al. |
| 2003/0200042 | A1 | 10/2003 | Gan et al. |
| 2005/0055132 | A1 | 3/2005 | Matsumoto et al. |
| 2005/0263496 | A1 | 12/2005 | Kobayashi et al. |
| 2005/0273202 | A1 | 12/2005 | Bischoff |
| 2006/0069466 | A1 | 3/2006 | Kato et al. |
| 2006/0081175 | A1 | 4/2006 | Nagase |
| 2006/0145647 | A1 | 7/2006 | Kitatsuji et al. |
| 2007/0106421 | A1 | 5/2007 | Kamrani et al. |
| 2008/0009972 | A1 * | 1/2008 | Nihei ..................... B25J 9/1669 700/245 |
| 2008/0319557 | A1 | 12/2008 | Summers et al. |

FOREIGN PATENT DOCUMENTS

| | | |
|---|---|---|
| JP | 7-168617 | 7/1995 |
| JP | 7-246581 | 9/1995 |
| JP | 9-081227 | 3/1997 |
| JP | 9-212225 | 8/1997 |
| JP | 10-044074 A | 2/1998 |
| JP | 10-083208 A | 3/1998 |
| JP | 2001-353676 A | 12/2001 |
| JP | 2003-103491 A | 4/2003 |
| JP | 2004-160588 A | 6/2004 |
| JP | 2007-515872 | 3/2012 |

OTHER PUBLICATIONS

Freund, E. et al., "Systems Approach to Robotics and Automation." Proceedings of the International Conference on Robotics and Automation, Nagoya, Japan, May 21-27, 1995, IEEE, New York, vol. 1, May 21, 1995, pp. 3-14.

Duelen, G. et al., "CAD/CAM-unterstütztes Umrüsten Von Produktionsanlagen," ZWF Zeitschrift Fur Wirtschaftliche Fertigung und Automatisierung, Carl Hanser Verlag, Munich, Germany, vol. 86, No. 8, Aug. 1, 1991, pp. 381-386.

International Preliminary Report on Patentability in connection with International Patent Application No. PCT/EP2005/006436 issued Jun. 27, 2006.

International Search Report in connection with International Patent Application No. PCT/EP2005/006436 issued Feb. 21, 2006.

Interrogatory issued Mar. 27, 2012 in corresponding Japanes Patent Application No. 2007-515872.

Ahmad et al.. Coordinated Motion Control of Multiple Robotic Devices for Welding and Redundancy Coordination through Constrained Optimization in Cartesian Space, 1988, IEEE, Proceedings of International Conference on Robotics and Automation, Apr. 24-29, 1988, Philadelphia, PA, pp. 963-968.

* cited by examiner

METHOD AND SYSTEM FOR OFF-LINE PROGRAMMING OF MULTIPLE INTERACTING ROBOTS

RELATED APPLICATIONS

This application is a continuation in-part application of U.S. application Ser. No. 11/629,284, filed Aug. 22, 2007, which is a National Stage of Application No. PCT/EP2005/006436, filed Jun. 15, 2005, and which claims priority to U.S. Provisional Application No. 60/579,263, filed Jun. 15, 2004. The entire contents of these applications are hereby incorporated by reference in their entireties.

BACKGROUND

A system for off-line programming of multiple interacting robots is disclosed. The off-line program code can be verified in a computer simulation and downloaded for controlling multiple interacting robots.

Robots are flexible, precise, cost-effective and are well adapted to perform complex task sequences in a manufacturing environment. But there are many jobs that are too complex for a single robot. Extra robots can be used to alleviate some of these manufacturing issues.

The state of the art in manufacturing does not address verification, through simulation, that simultaneous robotic movements are properly coordinated to, for example, ensure that paths of multiple robots which interact with one another do not collide. Programming and coordinating several robotic movements simultaneously and efficiently can be a significant challenge.

SUMMARY

A method and apparatus are disclosed for off-line programming of multiple interacting robots. For example, a system for off-line programming of multiple interacting robots includes a computer for off-line programming and verification of program codes for multiple interacting robots and a robot controller connected to the computer to receive a download of at least one of the program codes for execution, at least one of the multiple interacting robots being controlled by the robot controller.

An exemplary method for off-line programming of multiple interacting robots includes defining a virtual robot cell in a robot program, creating a path in relation to geometric features of a part defined in the virtual robot cell of the robot program, and defining parameters. At least one robot path is automatically generated and verified in a simulation. The robot program is downloaded to a robot controller to control at least one of the multiple interacting robots.

BRIEF DESCRIPTION OF THE DRAWING FIGURES

Additional features and advantages will be apparent to those skilled in the art upon reading the following detailed description of preferred embodiments in conjunction with the accompanying drawings, wherein like elements have been designated by like reference numerals, and wherein.

DETAILED DESCRIPTION

Figure 1:
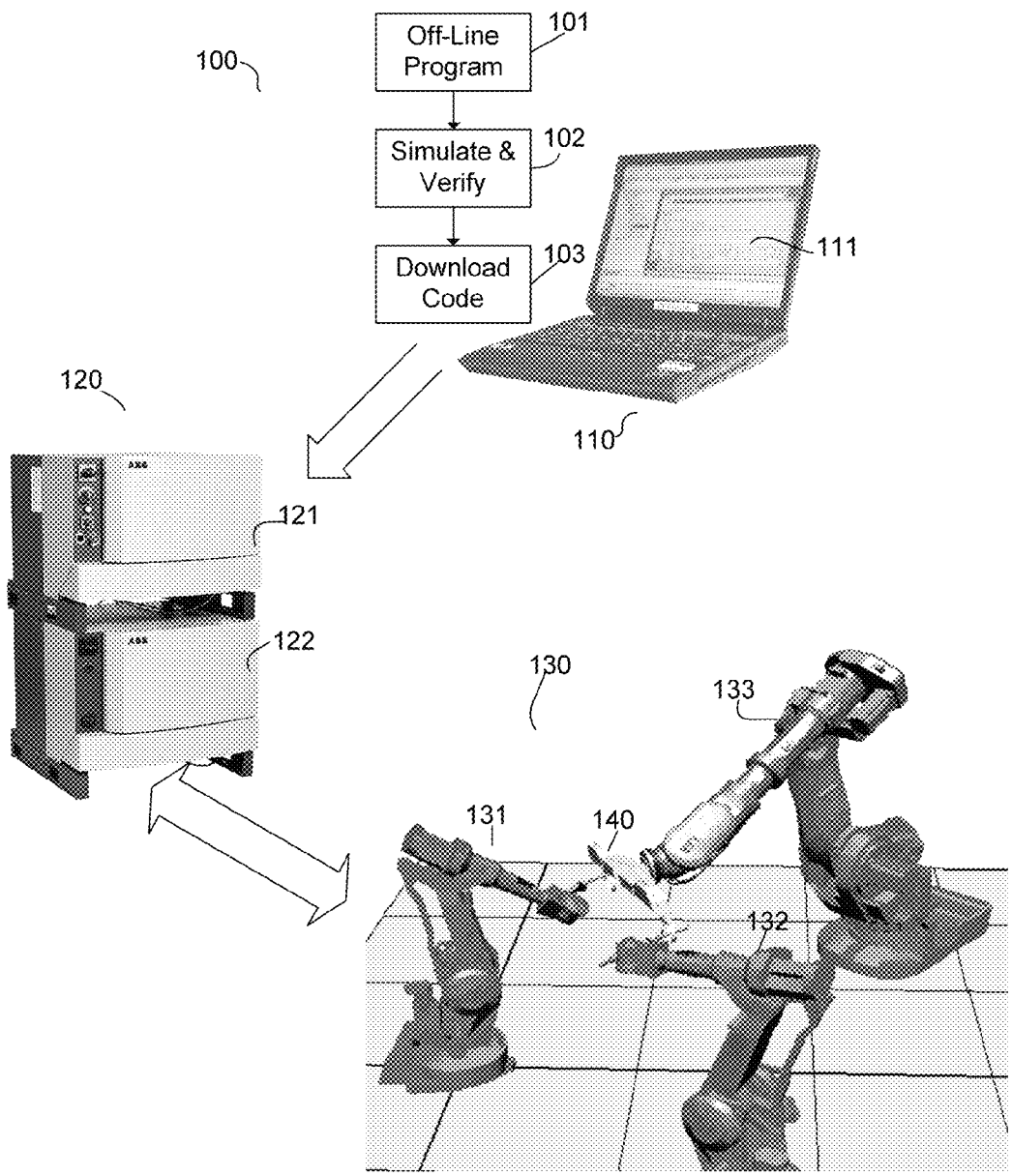
FIG. 1 shows an exemplary system for off-line programming of multiple interacting robots.

FIG. 1 shows an exemplary system 100 for off-line programming of multiple interacting robots 131-133. The system 100 includes a computer 110 for off-line programming and verification of program codes 111 for multiple interacting robots 131-133 and a controller 120, such as a separate off-board and/or an on-board robot controller, connected to the computer 110 to receive a download of at least one of the program codes for execution. The robot controller 120 can control multiple interacting robots 131-133 in a real production cell in which the robots interact and operate as a production unit.

The computer 110 can be used for off-line programming and verification of any or more of the program codes. The program codes as verified can be downloaded for controlling multiple interacting robots, for example, a plurality of process robots 131, 132 in combination with a differently configured handling robot 133 for multiple processing. Each of the multiple interacting robots is defined by a robot configuration and assigned a task type, for example, by identifying the respective robot as being a process robot or a handling robot. For example, a user can interact with the computer 110 to define a virtual robot cell 130 in a robot program 111. The user can interact with the computer 110 for defining parameters, automatically generate at least one robot path in relation to a part, and verify the at least one robot path in a computer simulation executing the robot program. As exemplified in blocks 101 and 102, the programming activities can be conducted off-line, in whole or in part, and verified in a computer simulation environment.

In block 103, one or more of the executable code (codes) of the robot program can be downloaded from the computer 110 to a robot controller 120 to control multiple interacting robots 131-133. One or more of the multiple interacting robots 131-133 can be controlled by at least one controller 121, 122 executing the program code (codes) 111 for processing at least one part 140 by the multiple interacting robots 131-133. For example, a robot controller 121 can be configured to simultaneously control up to four or more multiple interacting robots. Alternatively, individual robot controllers 121, 122 in a robot control rack 120 can each control a respective robot.

The robot program is capable of controlling a variety of robot types, for example, process and handling robots in a variety of movement modes, including independent motion, synchronized coordinated motion, and coordinated motion. The multiple interacting robots 231-233 can be a variety of robot types and configurations. For example, a process robot is typically a multi-axis (for example, 6 axes) robot capable of translational and/or rotational movements. A process robot can hold a variety of tools for processing, and a handling robot handles a part to be processed. The robotic process can be directed to a part to perform, for example, welding, arc welding, gluing, painting, cutting, etc. in relation to the part.

Figure 2:
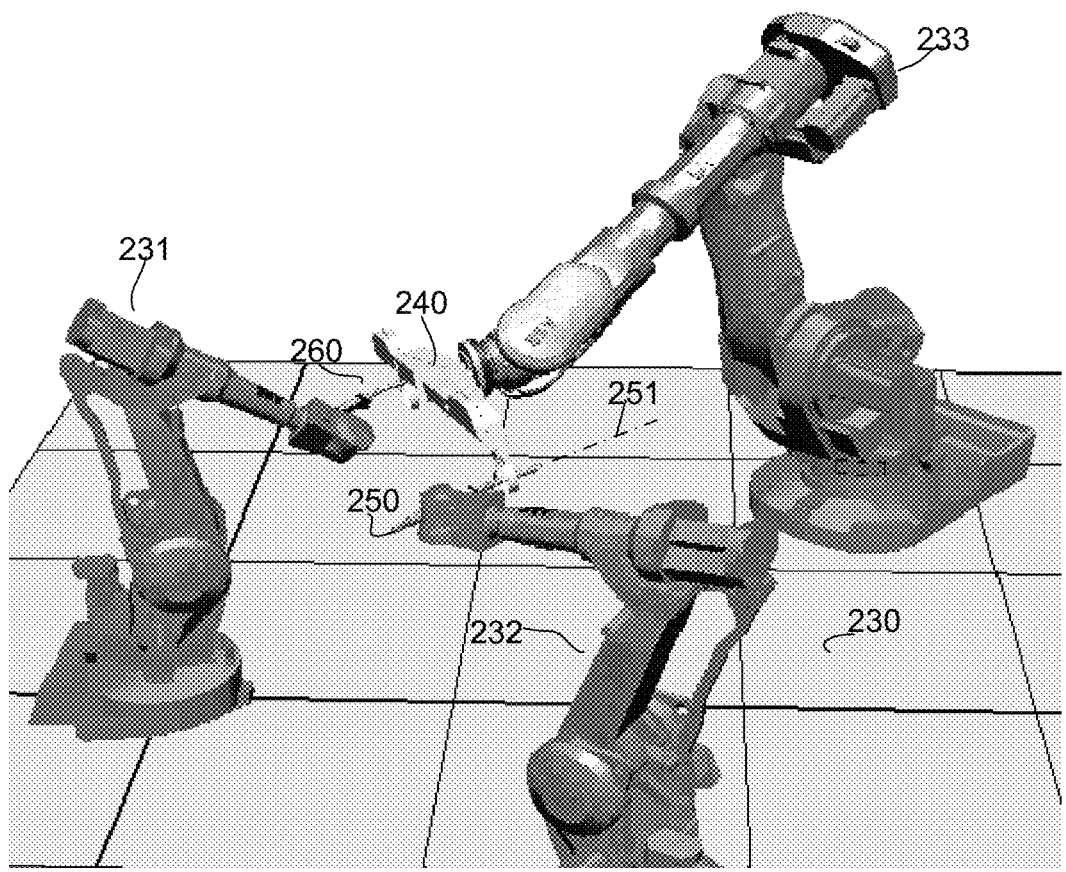
FIG. 2 shows an exemplary robot cell configuration of multiple interacting robots capable of flexible part positioning.

FIG. 2 shows an exemplary robot cell configuration of multiple interacting robots capable of flexible part positioning. A plurality of process robots 231, 232 are shown in combination with a similarly movable handling robot 233 for flexible part 240 positioning while the process robots 231, 232 individually manipulate a tool 250, 260 for part processing, for example, welding, arc welding, gluing, painting, cutting, drilling and/or boring. The off-line programming can create a path 251 of a tool 250 in relation to geometric features of a part 240 defined in a virtual robot cell 230 of the robot program. In the example of FIG. 2, path 251 is created for process robot 232 to manipulate tool 250 along path 251. Similar paths can be created for other process robots and one or more handling robots (e.g., handling robot 233 in FIG. 2) based on parameters which are defined as constraints to be taken into consideration in the control of the multiple robots, as described in more detail below. The virtual robot space is an area in which the multiple robots interact with one another using the robot program codes. The off-line programming used to produce the robot program codes can define attributes of a tool 250, 260, for example, tool speed and a tool orientation in relation to a part, and can facilitate user optimization of the program code (codes).

Figure 3:
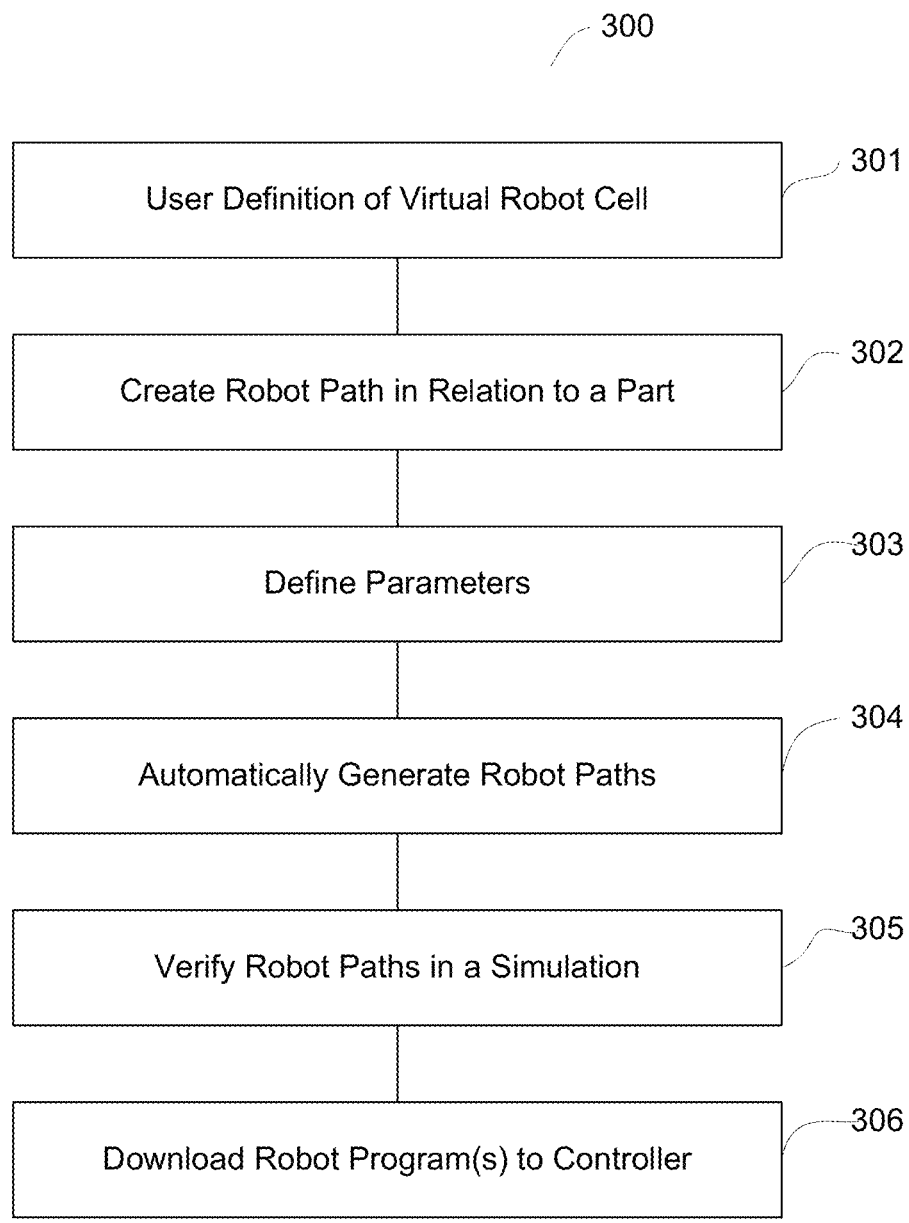
FIG. 3 shows an exemplary workflow overview for off-line programming of multiple interacting robots.

FIG. 3 shows an exemplary workflow overview for off-line programming of multiple interacting robots. As exemplified by the workflow overview 300, the method for off-line programming of multiple interacting robots to generate a downloadable robot program can include a user definition of a virtual robot cell in a robot program as shown in block 301.

User definition of a virtual robot cell in block 301 can include importing robots into a virtual robot cell in a simulation environment, and importing design data capturing the geometric features of a part. A virtual robot cell includes the virtual robot space in which multiple robots interacting as a production unit is modeled. For example, the dimensions of a real production area in which the robots operate can be defined in the robot program in relation to virtual robots imported, or modeled into, a virtual robot cell. Additional objects (virtual objects) can be modeled into the virtual robot cell, for example, conveyors, tracks, and parts to be processed.

A virtual robot can be defined based on, for example, its geometric features and motion logic. For example, starting with a base of a robot, a base frame can be defined based on, for example, a coordinate position and the base orientation in the virtual robot cell. A multi-axis robot can have one or more linked arms, such as three or more linked arms, each having an arm length. A robotic joint can be active (moveable) or deactivated (locked), and can be of a specific joint type, such as rotational or translational. The joint defines at least one axis of movement. In the following, the terms joint and axis or axes are used synonymously. The traversing end of a multi-axis robot can be referenced with respect to a tool center point.

Design data representing captured geometric features of a part can be imported into an off-line programming environment. In importing of design data capturing the geometric features of a part, a user can, for example, use known computer-assisted design (CAD) techniques to create and import a separately modeled geometry of a real part to an off-line programming environment to define the geometric features in relation to a robot in a virtual robot cell. For example, having imported the geometric features in relation to a robot in a virtual robot cell, a path can be created along the geometry of a modeled part for processing.

To make the off-line simulation as realistic as possible, as many virtual objects as required can be modeled together in a virtual robot cell. A user can thereby evaluate different positions of the virtual objects and detect possible collisions and other modeled anomalies between moving objects. The user can also evaluate if a robot as modeled is capable of reaching all targets (part positions) necessary for the part processing task.

In block 302, a path can be created in relation to geometric features of a part defined in the virtual robot cell. In block 302, the creation of a path in relation to a part can include creating at least one path along a geometrical feature of the part defined in the virtual robot cell, and defining a process to be performed on the part along the path. For example, with the aid of a visual graphics display of an orientation of a part, a user can visually create a trajectory intended to translate to a robot path along, through or in relation to a modeled geometrical surface feature of an object (part) to be processed. The actual means of user input can be a wide range of existing methods, including the use of keyed entry of data, cursor positioning using a mouse or like peripheral device, a pen manipulation on the display itself, or any combination of such user interface devices and techniques. The process on a part can include, but is not limited to, welding, arc welding, gluing, painting, cutting, drilling and/or boring.

In block 303, a user can define parameters. User definition of parameters in block 303 can include, for example, defining a robot task type, identifying at least one of a process robot and a handling robot. If a tool is associated with a robot, a user can define the operating parameters, for example, a tool speed along the path and a tool orientation in relation to the part. The robot configuration can be defined depending upon the robot being modeled for control. Parameters can be optimized for the process being modeled. For example, user defined parameters can be optimized with respect to at least one of cycle time, life time, and energy consumption.

In block 304, at least one robot path is automatically generated off-line in the computer simulation environment. The automatic generation using inverse kinematics in block 304 can include automatically generating at least one path for at least one imported robot based on the defined parameters, and the computer automatically generates a robot program for the robots imported in the virtual robot cell. In block 305, the at least one robot path can be verified in the simulation. In block 306, the robot program (for example, at least one robot controller code) can be downloaded, for example, to a robot controller to control multiple interacting robots in a real production environment.

After parameters are defined for the path, an exemplary method can automatically generate the robot path in block 304 using, for example, mathematical solutions used in solving inverse kinematics problems. For example, suitable mathematical solutions are described in "Effizienter industrieller Einsatz bahnsynchron kooperierender Roboter (translated, A More Efficient Industrial Application of Path-Synchronously Cooperating Robots)," by Heribert Münch et al., dated Aug. 13, 2001 (10 pages), which is incorporated herein by reference in its entirety.

Inverse kinematics, as referred to in the Münch et al. article, relates generally to the process of controlling motion based on calculated positions in space of a point on a linked structure, such as a robot or robots, given the position and angles of all joints on the robot or robots. Inverse kinematics applies to movement planning for cooperating kinematics involving a transformation between task and robot coordinates, movement synthesis for arbitrarily redundant kinematics, and movement synthesis for continuously cooperating kinematics while utilizing the system redundancy for the movement optimization.

For solving an inverse kinematic problem, a conditional equation is linearized:

$$\underline{x} = \underline{f}(\underline{q}) \quad (1)$$

$\underline{x} \in R^m$ represents task coordinates and $\underline{q} \in R^n$ represents robot coordinates. The resultant linear substitute problem $$\Delta\underline{x} = \underline{J} \cdot \Delta\underline{q} \quad (2)$$

can be solved by describing the kinematics according to the Denavit-Hartenberg convention. Denavit and Hartenberg used screw theory to show that the most compact representation of a general transformation between two robot joints required four parameters. Local solutions are determined for non-redundant systems (m=n) according to the Gaussian elimination method. The necessary global solution of the inverse kinematic problem can be generated using a modified Newton-Raphson method.

In applying inverse kinematics to the presently disclosed off-line programming of multiple interacting robots, the kinematics solution can be calculated in a forward direction. A forward kinematics calculation is a sequence of calculation as it relates to a robotic movement. For example, a forward kinematics calculation can start from a base frame which is referenced to the base of a robot, through the linked multi-axis robotic arms, and derive the final movement synthesis for the processing task. The movement synthesis can be based on a tool center reference frame. Such a forward kinematics solution for the robot program code incorporates one or more of the following parameters:

a number of robots;
a number of active joints in a multi-axis robot, including a penalty value assigned per identified active joint;
a joint type (translational or rotational);
coordinate values for a robot base reference frame and a tool center reference frame;
kinematics type or a kinematics rule;
identification of locked or deactivated joints for fast forward kinematics calculations; and
a choice of alternative stepped axis motions.

The tool movement can be, for example, translational, rotational, or a combination movement. Robotic arm joints can each be designated active (moveable) or deactivated (locked) for achieving a fast forward kinematics solution. In case of evaluating a choice of motion, various alternative axis motions, for example, axis motions by different axes, can be investigated for the user to evaluate and choose per stepped (delta) motion.

As described above, each joint of the handling robot(s) and the processing robot(s) has at least one axis of movement, respectively. In accordance with an exemplary embodiment, the parameters, which are defined as constraints to be taken into consideration in the control of the multiple robots, can assign a corresponding penalty value to each axis of the handling robot(s) and the processing robot(s).

Unique penalty factors can be applied to a forward kinematics solution to better achieve the desired movement synthesis. For example, the axis movement of an active axis with one assigned penalty value can be given a greater weight towards control movement, compared to the axis movement with another assigned penalty value. These assigned penalty values help to factor in the real operating and/or environmental factors affecting robotic movements. For example, the effect of gravity and the inertial momentum on the robotic arm linkages can variously deviate the traversal path of an arm in a given direction. One solution is to simply deactivate or lock a certain number of axes or arms at an orientation to increase the desired stability and the speed of solution. In another example, however, a greater use of a moveable (active) arm closest to the processing tool, or the part being worked, to achieve a refined movement synthesis may demonstrate an increased precision and stability in motion synthesis, when compared to attempting to achieve the same movement using just activation/deactivation of chosen linkages in a multi-axis robot. In another example, the parameters include a penalty value assigned to joints of each of one or more handling robot and one or more process robots such that movement of the axes of the handling robot closest to the part is penalized less than other axes of the handling robot, and movement of the axes of the process robot closest to the tool processing the part is penalized less than other axes of the process robot. Accordingly, using penalty values with active axis calculations, for example, per individual (active) axis movements, can be used to improve the yield and the quality of the process output.

As discussed above, exemplary embodiments of the present disclosure relate to off-line programming of at least one process robot including a tool and at least one handling robot holding a part, which is processed by the process robot(s). Thus, the process robot performs work, such as welding, gluing, painting and cutting, for example, in relation to the part held by the handling robot. The end effectors of the robots must work very close to each other in order to achieve the work to be carried out. Sometimes, the handling robot must carry out reorientation of the part at the same time as the process robot processes the part, which leads to simultaneous movements of the handling robot and the process robot. This means that the process robot and the handling robot must cooperate with each other in order to perform the work, which requires complex interactions between the robots. The present disclosure provides a mechanism to coordinate simultaneous movements of the robots with each other to, for example, ensure that the robots do not collide, while performing the complex interactions required when one robot performs work on a part held by another robot. Thus, the present disclosure provides how to program a process robot and a handling robot so that their motions are properly coordinated with each other while carrying out work on a part held by the handling robot.

According to an exemplary embodiment of the present disclosure, during the off-line programming, the axes of the process robot and the holding robot are assigned penalty values. The penalty values are, for example, chosen so that the movement of the axes of the handling robot closest to the part is used more than the other axes of the handling robot, and so that the movement of the axes of the process robot closest to the tool processing the part is used more than the other axes of the process robot, as discussed above. Accordingly, the movement of the axes of the handling robot closest to the part is penalized less than the other axes of the handling robot, and that the movement of the axes of the process robot closest to the tool processing the part is penalized less than the other axes of the process robot(s). This is advantageous particularly given a robot manipulator having large and heavy joints near the base of the robot, which create large and more inaccurate motions of the end effector of the robot, and smaller joints near the end effector, which create smaller and potentially more accurate motions. Thus, by assigning larger penalty values to the larger joints, and assigning smaller penalty values to the smaller joints closest to the tool and work object, the result will be that the smaller joints are used more (greater use) than the larger joints, producing a more accurate and effective motion for all of the robots. This leads to an increased precision and stability in the motions of the end effectors of the robots, which hold the tool and the part.

Accordingly, using penalty values in this way improves the yield and the quality of the process output. Note that while a penalty value is assigned to each active joint of the handling robot and the process robot, exemplary embodiments of the present disclosure account for all of the cooperating robots working together. The will ensure that the process robot and the handling robot will continue to keep 'together', i.e. closing a kinematic chain. Thus, programming of the complex interactions required when one robot performs work on a part held by another robot is facilitated.

The handling robot moves along a path of its own at the same time as the process robot follows a path defined in relation to geometrical features of the part to be processed. The respective paths of the handling robot(s) and the processing robot(s) are each generated based on the parameters. According to an exemplary embodiment of the present disclosure, both those paths are generated (created) based on the penalty values.

By setting a higher penalty value on a joint, that joint's movement will be penalized and the system will adjust the motions of all the other joints of all the other robots such that the penalized joint is given less motion. This is advantageous particularly given a robot manipulator where the large heavy joints near the base create large and possibly more inaccurate motions of the tool while the joints near the tool and work object create smaller and potentially more accurate motions. Thus by penalizing the larger joints more, and the smaller joints closest to the tool and work object less, the result will be that the smaller joints are used more (greater use) than the larger joints, producing a more accurate and effective motion for all of the robots.

The robot program encompasses various movement modes of multiple interacting robots, including independent motion, synchronized coordinated motion, and coordinated motion. Robot paths can be verified 305 in a simulation of the robot program using a computer. Through computer simulation, the expected behavior of the multiple interactive robots can be verified. The robot program can be used to control robots within a cell for performing a process, for example, an arc welding operation, the robot program can define the tasks each of the robots are to execute, and define the relationship between the independently controllable robots.

The robot program can be reprogrammed and re-evaluated for downloading to execute the programmed robot interactions. Should the computer simulated behavior of the multiple interactive robots does not meet the user expectations, for example, the system parameters can be redefined as necessary to change the simulated behavior and re-simulated to achieve the desired expected behavior of the multiple interactive robots prior to download 306, for example, from a computer to a robot controller. The executable code (codes) of the robot program can be executed in the robot controller to control multiple interacting robots in a real production cell.

Figure 4:
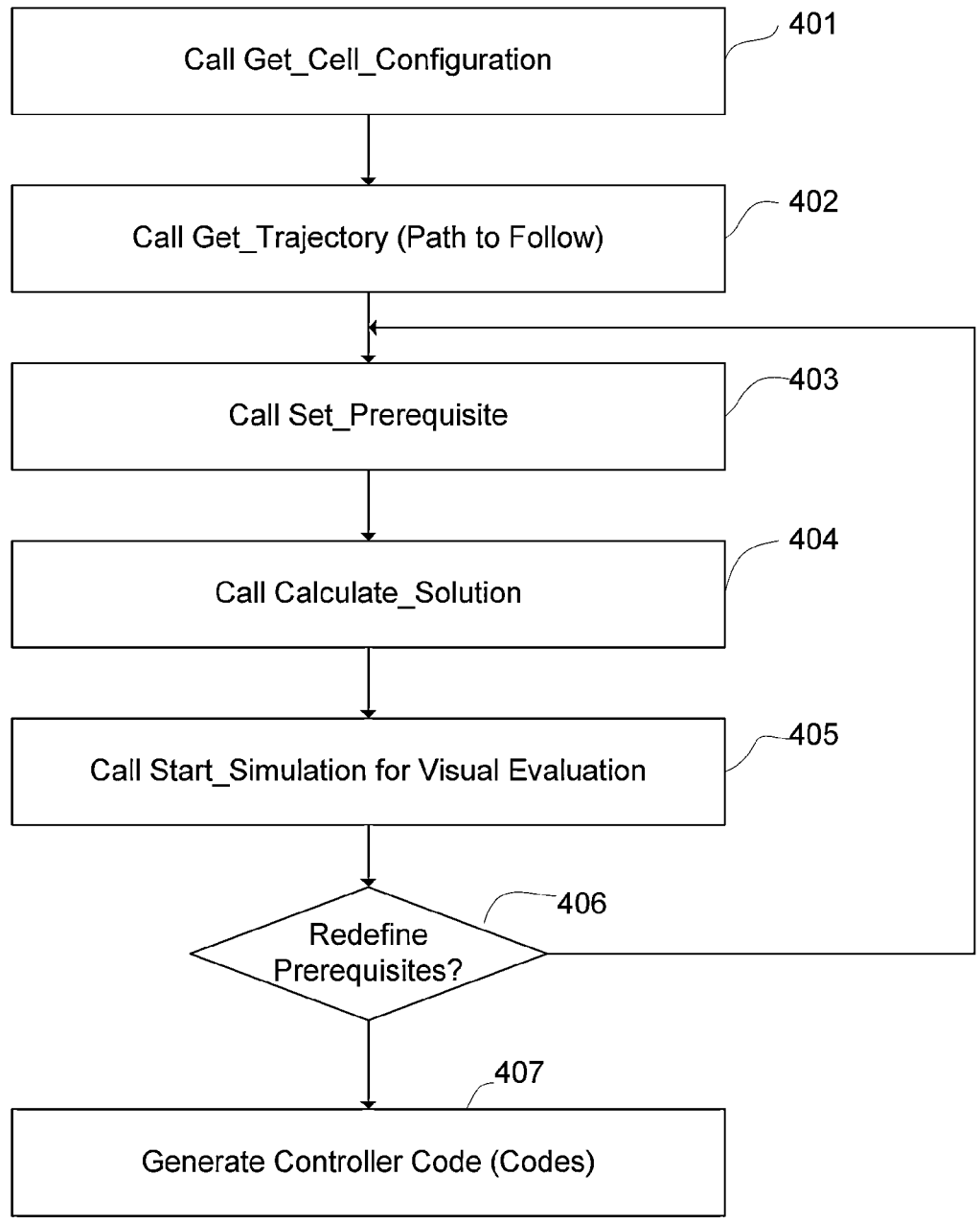
FIG. 4 shows an exemplary flowchart of high-level routines for off-line programming of multiple interacting robots.

As exemplified in FIG. 4, a computer readable program code (or codes) can implement executable functions for interactive off-line programming and simulation, for example, defining a virtual robot cell configuration in a robot program code (codes), defining a trajectory of a robot path in relation to the virtual robot cell configuration of the robot program code (codes), for defining system parameters, automatically generating at least one robot path, simulating the at least one robot path for verifying the robot program code (codes). The robot program code (codes) can be reprogrammed and re-evaluated, if necessary. At least one robot controller code is generated for a robot controller.

A computer-readable medium having a computer readable program code stored thereon is disclosed for off-line programming of multiple interacting robots. The computer readable program code implements: a routine for defining a virtual robot cell as a space in which multiple robots interact with one another using a robot program code; a routine for defining a trajectory of a robot path in relation to the virtual robot cell; a routine for defining system parameters; and a routine for automatically generating at least one robot path. A routine simulates the at least one robot path for verifying the robot program code.

A routine in the computer readable program code (codes) for defining a virtual robot cell 401 can include a routine for importing robots into a virtual robot cell in a simulation environment and a routine for importing CAD data capturing the geometric features of a part in relation to the robots in the simulation environment. Other modeled objects, for example, conveyors and tracks, can be imported into the virtual robot cell.

A routine in the computer readable program code (codes) for defining a trajectory of a robot path 402 in relation to the virtual robot cell configuration of the robot program code (codes) can include a routine for creating at least one path along a geometrical feature of a part defined in a virtual robot cell and a routine for defining a process to be performed on the part along the path. The process to be performed can include, but is not limited to, at least one of welding, arc welding, gluing, painting, cutting, drilling and boring.

A routine in the computer readable program code (codes) for defining system parameters 403 can include, but is not limited to, a routine for defining a robot task type, identifying at least one of a process robot and a handling robot; a routine for defining a tool speed along the path; a routine for defining a tool orientation in relation to the part; a routine for defining a robot configuration; and a routine for setting a process optimization.

A routine in the computer readable program code (codes) for automatic generation of at least one robot path 404 can include, but is not limited to, a routine for automatically generating the paths at least one path for at least one imported robot based on the defined system parameters and a routine for generating a robot program for the robots imported in the virtual robot cell. An inverse kinematics calculation can be applied for generating at least one robot path. In one embodiment, forward kinematics calculation as previously set forth is implemented.

A routine in the computer readable program code (codes) for simulating 405 the at least one robot path can include, but is not limited to, a routine for computer simulation of a behavior of the multiple interactive robots and a routine for user redefinition of the system parameters to change the computer simulated behavior. Running the simulation 405 facilitates visual evaluation of the results, verification of the robot program code (codes) in a computer simulation environment and redefinition of the system parameters for reprogramming. Depending on the results of the evaluation, in block 406, a user can redefine the system parameters to iterate the off-line programming process and yield modified evaluation results prior to generation of the robot controller code (codes) in block 407.

The computer readable program code (codes) can incorporate advanced control features, including, but not limited to:
  Dynamic multi-axis robotic control modeling, incorporating advanced control features, for example, penalty value adjustments for real operating physical parameters, advanced servo control, accurate path holding, speed independent path, electronically stabilized path, self optimizing acceleration control, and protection against overload;

Simultaneous optimization of path holding and cycle;
Accurate off-line programming and verification; and
Other automated optimization features to enhance overall interacting robotic performance, for example, cycle time, life time, and energy consumption.

Other advanced control features incorporated in the computer readable program code (codes) includes, but not limited to, independent motion, synchronized coordinated motion, and coordinated motion.

Figure 5:
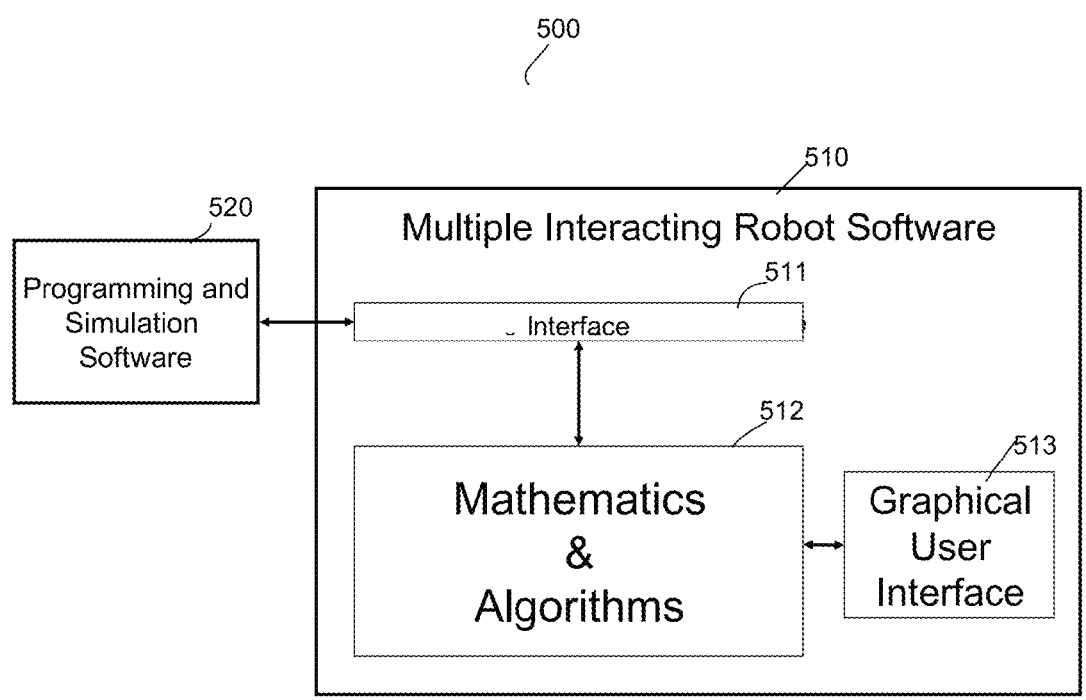
FIG. 5 shows an exemplary functional block diagram for off-line programming of multiple interacting robots.

FIG. 5 shows an exemplary functional block diagram of a computer software system implemented for off-line programming of multiple interacting robots. The multiple interacting robot control software 510 is shown as a software plug-in interfaced 511 to a computer programming and simulation software 520 for illustrative purposes. Together, the off-line programming of multiple interacting robots 500 affords an integrated computer-based tool for offline planning, programming and simulation of multiple interacting robots. The multiple interacting robot control software 510 and the computer programming and simulation software 520 make control of the multiple interacting robots easy to plan, easy to program and easy to use. Exemplary benefits of the computer software system include a simplified programming of the control of the multiple interacting robots and integrating technical production constraints into the programming.

The off-line programming of multiple interacting robots 500 can be used to define a virtual robot cell. As previously set forth, a path is created along the geometry of a part. This path can, for example, be associated with the geometry of the workpiece to be arc welded. The system parameters can then be defined as constraints to be considered in the control of the robots in the cell. Predetermined constraints can include, among others, tool orientation, cycle time and robot orientation. Optimization can be based on quality criteria such as: use of maximum speed through reducing the load on the limiting axis, minimizing cycle times, reducing mechanical stress on the complete system or individual axes. After constraints have been defined, the off-line programming of multiple interacting robots 500 automatically generates the robot paths.

Using FIG. 2 for illustrative purposes, an exemplary program for multiple interacting robots can involve a two-robot arc-welding cell. In such a task, the process of automatically generating robot paths defines which tasks each of the two robots 231, 233 should execute, and defines the relationship between the two independently controllable robots. One of the robots 233 can hold an object 240 in a desired orientation while the second robot 231 performs the arc weld along the specified path.

Turning back to FIG. 5, the mathematics and algorithm module 512 can incorporate system parameters defined as constraints to be taken into consideration in the control of the multiple robots included in a cell for operating upon the part. For example, predetermined constraints can include tool orientation, speed of operation, robot orientation, or any other desired constraints. A forward kinematics solution for the robot program code incorporates one or more of the following parameters:
 a number of robots;
 a number of active joints in a multi-axis robot, including a penalty value assigned per identified active joint;
 a joint type (translational or rotational);
 coordinate values for a robot base reference frame and a tool center reference frame;
 kinematics type or a kinematics rule;
 identification of locked or deactivated joints for forward kinematics calculations; and
 a choice of alternative stepped axis motions.

Other events affecting the multiple interacting robots can be taken into account, including:
 Change, delete or insert a robot from the robot cell;
 Close or load a robot cell; and
 Change path.

The resulting programmed paths can be read, created, modified with the aid of a graphical user interface 513. The programmed path can be further specified with, for example, the desired speed, motion type, and lead type. The parameters are saved.

The constraints being defined for the path, the mathematics and algorithm module 512 can automatically generate the robot path using, for example, mathematical solutions which are known for use in solving inverse kinematics problems, such as those described in "Effizienter industrieller Einsatz bahnsynchron kooperierender Roboter", by Heribert Munch et al., dated Aug. 13, 2001 (10 pages), which is incorporated herein by reference in its entirety.

After automatically generating robot path, the paths of the robots can be verified in a simulation. Robot programs produced on the basis of simulation can be downloaded and, for example, stored in a robot controller used to control the robots included in the cell.

Although the foregoing exemplary embodiment implements the multiple interacting robot control software 510 as a software plug-in to a computer programming and simulation software 520, the described functional delineations and the method of implementation are intended to be exemplary, but not limiting. All equivalent implementations, including software, firmware and hardware realizations of some or all of like functions are within the scope of the present invention.

The foregoing computer readable program codes, including the robot controller codes, can be embodied in any computer readable medium for use by or in connection with an instruction execution system, apparatus, or device, such as a computer based system, processor containing system, or other system that can fetch the instructions from the instruction execution system, apparatus, or device and execute the instructions.

As used here, a "computer readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non exhaustive list) of the computer readable medium can include the following: an electrical connection having one or more wires, a portable computer diskette, a random access memory (RAM), a read only memory (ROM), an erasable programmable read only memory (EPROM or Flash memory), an optical fiber, a portable compact disc read only memory (CDROM), a mass storage, a server memory, a standalone storage device, a hard disk, a disk array, and a virtual storage device.

It will be appreciated by those of ordinary skill in the art that the concepts and techniques described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

The invention claimed is:

1. A system for off-line programming of multiple interacting robots, comprising:
    at least one handling robot holding a part and at least one process robot having a tool for processing the part;
    a computer for off-line programming and verification of program codes for multiple interacting robots, wherein the computer is configured to
        define a virtual robot cell including the handling robot, the process robot and the part,
        incorporate parameters defined as constraints to be taken into consideration in the control of the multiple robots, the parameters including constraints enabling the at least one handling robot to move the part at the same time as the at least one process robot simultaneously perform active processing on the part,
        create at least one path for the holding robot based on the parameters,
        create at least one path for the process robot defined in relation to geometric features of said part defined in the virtual robot cell based on a trajectory defined in relation to said part, and said parameters,
        automatically generate program code based on the created paths, and
        verify the created paths in a simulation executing the program code; and
    a robot controller for controlling the robots, which controller is connected to the computer to receive a download of the program code for execution.

2. The system in accordance with claim 1, wherein said constraints include at least one of tool orientation, cycle time, and robot orientation.

3. The system in accordance with claim 1, wherein the processing includes at least one of welding, arc welding, gluing, painting, cutting, drilling and boring.

4. The system in accordance with claim 1, wherein the robot controller is capable of controlling up to four multiple interacting robots.

5. The system in accordance with claim 1, wherein the multiple interacting robots operate in a movement mode including at least one of independent motion, synchronized coordinated motion, and coordinated motion.

6. The system in accordance with claim 1, wherein:
    a robot configuration is defined for each of the multiple interacting robots, respectively, and each of the multiple interacting robots is assigned a task type, identifying each robot as being a process robot or a handling robot, respectively;
    at least one of the multiple interacting robots operates a tool having at least one of a tool speed and a tool orientation in relation to a part; and
    the off-line programming facilitates user optimization of the program codes.

7. The system in accordance with claim 1, wherein a plurality of interacting robots are process robots for multiple processing.

8. The system in accordance with claim 1, wherein at least one of the multiple interacting robots is a handling robot for flexible part positioning.

9. The system in accordance with claim 1, wherein each joint of the at least one handling robot and the at least one processing robot has at least one axis of movement, respectively, and the parameters assign a corresponding penalty value to each axis of the at least one handling robot and the at least one processing robot.

10. The system in accordance with claim 1, wherein each joint of the at least one handling robot and the at least one processing robot has axes of movement, respectively, and
    wherein the parameters include a penalty value assigned to each joint of each of the at least one handling robot and the at least one process robot such that movement of the axes of the handling robot closest to the part is penalized less than other axes of the handling robot, and movement of the axes of the process robot closest to the tool processing the part is penalized less than other axes of the process robot.

* * * * *